(12) United States Patent
Gauthier et al.

(10) Patent No.: US 12,222,781 B2
(45) Date of Patent: Feb. 11, 2025

(54) HEATING SYSTEM USING HEAT EXTRACTED FROM A COMPUTER PROCESSING UNIT

(71) Applicants: Stephane Gauthier, La Broquerie (CA); Oscar Miller, Steinbach (CA); Hartley Torrealba, Richmond (CA); Anna Le Wong, Vancouver (CA)

(72) Inventors: Stephane Gauthier, La Broquerie (CA); Oscar Miller, Steinbach (CA); Hartley Torrealba, Richmond (CA); Anna Le Wong, Vancouver (CA)

(73) Assignee: 10130163 Manitoba Ltd., La Broquerie (CA)

( * ) Notice: Subject to any disclaimer, the term of this patent is extended or adjusted under 35 U.S.C. 154(b) by 972 days.

(21) Appl. No.: 17/209,716

(22) Filed: Mar. 23, 2021

(65) Prior Publication Data
US 2021/0271299 A1    Sep. 2, 2021

Related U.S. Application Data

(63) Continuation-in-part of application No. PCT/CA2020/050600, filed on May 5, 2020.

(30) Foreign Application Priority Data

May 7, 2019    (CA) .............................. CA 3042519

(51) Int. Cl.
*G06F 1/20*    (2006.01)
*H05K 7/20*    (2006.01)

(52) U.S. Cl.
CPC ........... *G06F 1/20* (2013.01); *H05K 7/20236* (2013.01); *H05K 7/20272* (2013.01); *G06F 2200/201* (2013.01); *Y02B 30/52* (2013.01)

(58) Field of Classification Search
CPC . G06F 1/20; G06F 2200/201; H05K 7/20236; H05K 7/20272; Y02B 30/52
(Continued)

(56) References Cited

U.S. PATENT DOCUMENTS

| 8,248,801 B2 * | 8/2012 | Campbell .......... H05K 7/20236 |
| | | 174/16.3 |
| 10,782,751 B1 | 9/2020 | Gauthier et al. |

(Continued)

FOREIGN PATENT DOCUMENTS

| CA | 3042519 | 9/2020 |
| JP | 2018009744 | 1/2018 |

*Primary Examiner* — Joel M Attey
(74) *Attorney, Agent, or Firm* — Adrian D. Battison; Ade & Company Inc.; Ryan W. Dupuis

(57) ABSTRACT

Computer processing systems are cooled and the otherwise wasted heat is extracted for space heating by providing a cooling dielectric liquid in a tank which passes from a manifold at the bottom of the tank through an array of tubular housings each having open top and bottom ends and containing row of the circuit boards. The housings sit on a divider sheet which has arrays of openings aligned with the housings allowing the liquid to pass from the manifold under little or no pressure so that the liquid flows through the housings by convection and stratifies to generate a layer of heated liquid above the open tops of the housings which can be tapped off to a heat exchanger. A heat pump acts on the cooling liquid to transfer heat to a heat transfer liquid which can be further heated by a boiler and transferred to existing heat dissipating loads.

19 Claims, 6 Drawing Sheets

(58) Field of Classification Search
USPC .......................................................... 62/160
See application file for complete search history.

(56) References Cited

U.S. PATENT DOCUMENTS

2009/0126910 A1\* 5/2009 Campbell .......... H05K 7/20781
165/104.33
2011/0132579 A1\* 6/2011 Best ................... H05K 7/20836
165/104.31

\* cited by examiner

HEATING SYSTEM USING HEAT EXTRACTED FROM A COMPUTER PROCESSING UNIT

This application is a continuation in part application of PCT Application PCT/CA2020/050600 filed May 5, 2020 which claims priority from Canadian application 3042519 filed May 7, 2019.

This invention relates to an arrangement which includes a cooling tank to extract and utilize heat from the operation of the computer processing to maintain the unit cool and to enable the heat to be transferred and utilized in a separate heating operation.

BACKGROUND OF THE INVENTION

Currently the conventional way of cooling computers, servers or mining rigs is with air using high volume fans. This causes major problems with noise and dust control system equating to higher maintenance and set up costs.

It is known that many computer processing systems generate significant quantities of heat so that cooling is required. Examples of immersive liquid cooling systems for computer processing are shown in U.S. Pat. No. 9,504,190 (Best) issued to Green Revolution Cooling Inc and other patents by the same patentee and by Delphi Technologies in U.S. Pat. No. 7,307,841 (Berlin) and by Hardcore Computers Inc in U.S. Pat. No. 7,403,392 (Attlesey). However there have been no significantly successful techniques by which the heat from computer processing systems can be used effectively to provide heating to other structures or operations.

SUMMARY OF THE INVENTION

According to one definition of the invention there is provided a method for heating comprising:
  generating a stream of a heat transfer liquid;
  passing the heat transfer liquid through a heat source so that the heat source is able to apply heat to the heat transfer liquid;
  passing the heat transfer liquid through one or more heat dissipating loads to transfer heat from the heat transfer liquid to said one or more loads;
  providing in a tank a cooling liquid formed of a dielectric material;
  the tank containing a plurality of computer processing units, each comprising at least one computer processing board carrying electrical components which operates to carry out computer processing operations while generating heat;
  causing the cooling liquid to pass through the tank while causing cooling of the computer processing units so that the liquid is heated while cooling the computer processing units so as generate a first stream of cool liquid upstream of the heating of the liquid and a second stream of heated liquid downstream of the heating;
  circulating the cooling liquid from the second stream through a refrigeration cycle heat pump to the first stream so that the heat pump extracts heat from the second stream to return to the first stream;
  the heat pump transferring the extracted heat from the cooling liquid to the heat transfer liquid so that the heat transfer liquid passes from an inlet stream entering the heat pump to an exit stream leaving the heat pump and so that the heat transfer liquid passes both through the heat source and the heat pump for receiving heat from both.

According to a second definition of the invention there is provided a method for heating comprising:
  generating a stream of a heat transfer liquid;
  passing the heat transfer liquid through one or more heat dissipating loads to transfer heat from the heat transfer liquid to said one or more loads;
  providing in a tank a cooling liquid formed of a dielectric material;
  the tank containing a plurality of computer processing units, each comprising at least one computer processing board carrying electrical components which operates to carry out computer processing operations while generating heat;
  causing the cooling liquid to pass through the tank while causing cooling of the computer processing units so that the cooling liquid is heated while cooling the computer processing units so as generate a first stream of cool liquid upstream of the heating of the liquid and a second stream of heated liquid downstream of the heating;
  circulating the cooling liquid from the second stream through a heat pump to the first stream so that the heat pump extracts heat from the second stream to return to the first stream;
  the heat pump transferring the extracted heat from the cooling liquid to the heat transfer liquid so that the heat transfer liquid passes from an inlet stream entering the heat pump to an exit stream leaving the heat pump;
  wherein the temperature in the second stream of the cooling liquid is less than 60 degrees C. and the temperature in the exit stream of the heat transfer liquid is greater than 70 degrees C., preferably greater than 80 degrees C. and more preferably of the order of or greater than 90 degrees C.

Preferably in one embodiment, the heat pump is uses $CO_2$ as a refrigerant as this has heat differences (Delta T) which are particularly suitable for the temperatures available and required in the above method.

Preferably in one embodiment, the temperature in the second stream of the cooling liquid is less than 60 degrees C. and the temperature in the exit stream of the heat transfer liquid is greater than 70 degrees C.

Preferably in one embodiment, the temperature in the second stream of the cooling liquid is in the range 40 degrees C. to 60 degrees C. and the temperature in the exit stream of the heat transfer liquid is in the range 70 degrees C. to 95 degrees C. and more preferably around or above 90 degrees C.

These temperatures allow the temperature in one or more of the heat dissipating loads to be at least 90 degrees C. This has the advantage that such loads are typically designed to operate at this temperature so that any reduction in the temperature, while it may produce heating of the load, is often insufficient to meet design requirements.

Preferably in one embodiment, the temperature in the first stream of the cooling liquid is less than 45 degrees C. and the temperature in the inlet stream of the heat transfer liquid is greater than 50 degrees C.

Preferably in one embodiment, the temperature in the first stream of the cooling liquid is in the range 20 degrees C. to 45 degrees C. and the temperature in the inlet stream of the heat transfer liquid is in the range 50 degrees C. to 70 degrees C.

In one embodiment, the cooling liquid is circulated between the second and first streams by a liquid pump. However other embodiments may operate only by convection currents.

In one embodiment, the heat pump is located inside the tank and preferably within the cooling liquid. However in other arrangements the heat pump may be located outside the tank.

Preferably in one embodiment, the heat source comprises a boiler typically of the type which uses a combustion heating system such as gas or solid fuel to provide the required heating. In this arrangement, the heat dissipating loads and the boiler form an existing installation where the boiler and the loads such as radiators, heating elements and the like are designed to meet heating requirements at the set boiler temperature typically of the order of 90 degrees C. In this case, the tank, the cooling liquid, the plurality of computer processing units and heat pump are added to the existing installation as a supplementary heat source so that the heat from the computer processing is used as a further heat source which can be used as an alternative to the boiler or in replacement for heat from the boiler. In this arrangement the computer processing can become the main or primary heat source and the existing boiler can be used to supplement if the primary source cannot keep or as a replacement if the primary source is inactive for any reason.

Preferably in one embodiment, the cooling liquid is a vegetable oil such as soy bean or canola oil.

The arrangement herein there provides a solution to enhance both sides of the heating and cooling arrangement where the liquid to liquid (Oil to Glycol/water) loop is replaced with a CO2 Heat Pump (refrigeration cycle or compression type). These new more efficient environmentally friendly heat pumps utilize the hot temperature output of the tank at around 50 C (112 F) and bump it up to 90 C (190 F). The return loop (Cool side) of the heat pump is then reduced back to 25-30 C and is better able to absorb the heat from the cooling tank.

This acts to solve the difficulty of being able to tie into existing high temperature boiler systems that typically operate at 180-190 F. A major restriction we are seeing at the moment . . . . And allow us to operate very efficiently during warmer months in terms of cooling our tank without massive dry coolers to expel the heat. Would also allow use to use this set up in large commercial/industrial applications.

In this way the excess heat can be extracted and transferred to a heat exchanger which enables the extracted heat to be used in many different areas including but not limited to:

Commercial/Industrial in-floor or geo thermal hydronic heating systems
Greenhouses
Agricultural barns—Hog, Poultry and Dairy
Heating hot water in larger industrial application—Car/truck washes
Residential heating
Grain drying
*Cannabis* drying/Dehydration systems
Low temperature evaporation systems
*Cannabis* industry including heating and low temperature dehydrating
Aquaculture installation to heat water
Underground mining operations—heating mine shafts
Large swimming pools The arrangement herein provides a unique arrangement for space heating which uses computing chips as replacement of conventional heating elements creating a modulating resistive load heater. The idea is to utilize lower cost commercial electricity rates as well as a 100% renewable energy provided by electric utilities particularly hydro based utilities to do two functions: the first to provide space heating and second to provide a means of cooling for the intense revenue generating computing such as mining crypto currencies or similar data processing.

In recent years with the development of Blockchain technology, it has now become evident that this new method of computing will allow for more decentralized computing and would offer greater potential to install more robust and redundant data processing system simultaneously giving the ability to capitalize on all the heat generated.

This invention offers a solution for space heating especially in countries where the climate is colder. For example, many northern communities don't have access to natural gas and are typically heating with electric boilers and or fossil fuel boilers. This invention will allow for an easy "Quick Connect" option to efficiently integrate to an existing hydronic system. The boiler systems can be installed as individual units or as a module containing multiple boilers to achieve the desired heat output. The boiler design can be customized to any size with a large range, from 20 KW single tank to a 400+KW system. The tank design is such that it can be installed in either a standalone installation inside existing infrastructure or installed housed in a containerized module.

The arrangement herein can preferably be used with a specific design of the tank using a method for computer processing comprising:

providing in a tank a cooling liquid formed of a dielectric material;

the tank containing a plurality of computer processing units, each comprising:
  an exterior housing having a bottom opening at a bottom end and a top opening at a top end and defining a closed peripheral wall between the top and bottom ends;
  at least one computer processing board carrying electrical components mounted within the housing which operates to carry out computer processing operations while generating heat;

the tank having a dividing sheet in the tank dividing the tank into a bottom manifold below the dividing sheet and a main portion of the tank above the sheet;

the exterior housing of each computer processing unit being mounted on the sheet with the bottom opening located at the sheet and the peripheral wall upstanding within the tank to the top end which spaced from the dividing sheet;

a plurality of liquid transfer opening arrangements in the sheet where each opening arrangement is associated with a respective one of the housings to allow liquid from the manifold to enter the housing and pass through the opening;

introducing the cooling liquid into the manifold;

arranging a top surface of the liquid within the tank at a location which is above the top end of the exterior housings;

causing the liquid to enter through the opening arrangements into the exterior housings and to rise within the housings by convection caused by the heat within the housings and to exit from the housings through the top end into the tank;

the liquid exiting from the top ends of the housings forming a heated layer in the tank between the surface and the top ends;

extracting liquid from the layer;
and extracting heat from the extracted liquid to create a heat supply and to return cooled liquid to the manifold.

Preferably the top ends lie in a common plane defining a bottom of the layer to improve the stratification of the liquid in the layer as the hottest area of the tank to be tapped off. This zone depth can also be adjusted to accommodate various working fluid temperatures. The thicker the layer the hotter the fluid.

Typically the extracted liquid is returned to the manifold by a pump which is arranged to create a slight positive pressure such that the liquid is caused to flow through the housings substantially wholly by the convection rather than as a positive flow. This again improves the stratification of the liquid. No liquid enters the quiescent zones between the tubular housings so that this area again allows the heat to concentrate in the stratified heated zone at the top of the tubular housings. The housings are preferably wholly open at the top and bottom so that the peripheral wall is fully open at each end as this creates the required flow through the housings.

That is in one embodiment, the openings from the manifold through the divider sheet are located at the housings such that the liquid only enters the housings and not between the housings to form the quiescent zone.

In one embodiment, the openings each provide an array which is shaped to match the interior shape of the housing to generate a smooth flow rising in the housings so that for example the housings are rectangular in cross-section and the array is also rectangular and approximately matches the inside surface of the housing. For example, the array is formed by a series of parallel slots having a length approximately equal to the dimension across the housing but an array of other holes can be used.

In one embodiment, the tank is dimensioned so that it contains the housings arranged in rows and columns.

In one embodiment, the liquid is extracted through an opening at one side of the tank which can be provided as a single opening communicating to a single duct feeding to a separate heat exchanger.

Preferably the opening is arranged at a height above the top ends and below the top surface so as to extract only from the layer.

Preferably the liquid is a mineral oil, vegetable oil based or in some cases a fully synthetic dielectric fluid can be used.

Preferably the liquid has the one or more of the following characteristics:
Density: Near or in the range of 0.92 g/m3 (7.667 lbs/gal)
Kinematic Viscosity: Near or in the range of 33-35 mm$^2$/s @ 40° C. or near or in the range of 15 cSt @ 70° C.
Dielectric Breakdown: 2 mm [kV]≥35 (ASTM D6871)
Boiling point: 360° C.
Flash point: 265° C. (Closed Cup)
Auto/self-ignition temperature: 401-404° C. (ASTM E659)
Vapor Pressure: Near or in the range 0 PA @≤200° C.
Thermal Conductivity: Near or in the range of 0.15089 W/mK @ 70° C.
Specific Heat: Near or in the range of 2.3472 kJ/kgK @ 70° C.

Preferably the dielectric liquid is selected with the characteristics to cause very intense stratified temperature zone due to the inherent thermal insulating properties.

Preferably the dielectric liquid has properties that allow: a maximum heat transfer, a high working fluid temperature (above 60 degrees C.) and an efficient heat transfer.

Preferably the flow of liquid into the manifold and through the housings is arranged such that the temperature in the layer is in the range 10 to 60° C.

Preferably the flow of liquid into the manifold and through the housings is arranged such that the temperature returned to the manifold is in the range 30-85° C.

Preferably each computer processing unit is associated with an adjacent power supply which is contained within the tank alongside the associated housing where the power supply is located in and cooled by the liquid between the housings without any flow from the manifold.

Preferably the computer processing units are dropped out when a peak demand situation occurs.

Preferably the computer processing units are connected to utility smart meters to aid in peak demand management.

Preferably there is provided a U-shaped holder mounted on the sheet and arranged to hold the housing and the power supply supported upright.

Preferably the tank has a head zone that also acts as an expansion area to accommodate fluid level fluctuations. This head zone should be kept free from any moisture and should be equipped to filter out particulate matter as well as moisture.

Preferably the tank is completely sealed and vapour tight. The installation of a pressure relief check valve set at 1-2 PSI is installed to prevent any over pressures causing damage.

Preferably the computing rigs or processors used are able to be immersed without any modifications other than removing or disabling any fans installed. All the air cooling arrangements or fines can be left intact.

The idea was to develop a very simple cost-effective tank system to cool the computing rigs or chips using a dielectric fluids with certain properties that allow: a maximum heat transfer, a high working fluid temperature (above 60 degrees C.) and an efficient heat transfer. There are minimal to no moving parts in the tank. The result is a design that operates with only one small circulating pump that uses approximately 300 watts of power to pump the working fluid (Dielectric Fluid) through a heat exchanger.

In order to achieve a system with no moving or overly complex parts, the key was to try and minimize modifications required to conventional air-cooled computing rigs including utilizing the factory made aluminum bodies and power supplies. We designed a special holder where the CPU aluminum chassis or body is supported upright (Vertically) as well as the power supply to power each unit.

Another aspect of the tank design is the baffle plate to allow the cool working fluid to collect in the "Cool Zone" of the tank under the baffle plate where the circulating pump will create a slight positive pressure. The baffle plate has a number of precision cut slots that direct the fluid into each computing rig housings or "tubes". The amount and sizes of the slots is determined based on the viscosity of the fluid and the maximum temperature allowable before any damage can occur to the computing chips. This is typically maximum of 85 degree C.). The housings or "tubes" act a chimney and can be customized to accommodate any type of computing mother boards.

The combination of having the cool stream of working fluid pass through the baffle plates slots and directed into the aluminum mining rig bodies or tubes give a very strong thermal dynamic pumping action or chimney effect. This effect help to efficiently move the cooler working fluid from under the baffle plate through the tube structure, passed the computing boards including processing chips and carry away the intense heat generated.

Upon exiting the mining rig body or tube, the hot working fluid collects at the top of the tank area or "Hot Zone". Another interesting part of this invention is that we are able to efficiently remove the hot working fluid with only one port reducing complicated baffles designs and costly manifold systems. We use the natural tendencies of the dielectric fluid to cause very intense stratified temperature zone due to the inherent thermal insulating properties.

The design also allows the power supply which is suspended higher on the holder to use the "Neutral Zone" temperature to cool the power supplies (See drawings). The power supplies do not generate as much heat as the main computing boards or chips so less working fluid is required to circulate through the unit.

The system is designed to be fully modulating and remote controlled interface for isolated operations including northern regions of Canada and US. It can also be coupled to utility smart meters to aid in peak demand management. The systems can be designed to drop out when a peak demand situation occurs.

The current tank design can be suited from a residential setting to large industrial.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figure 1:
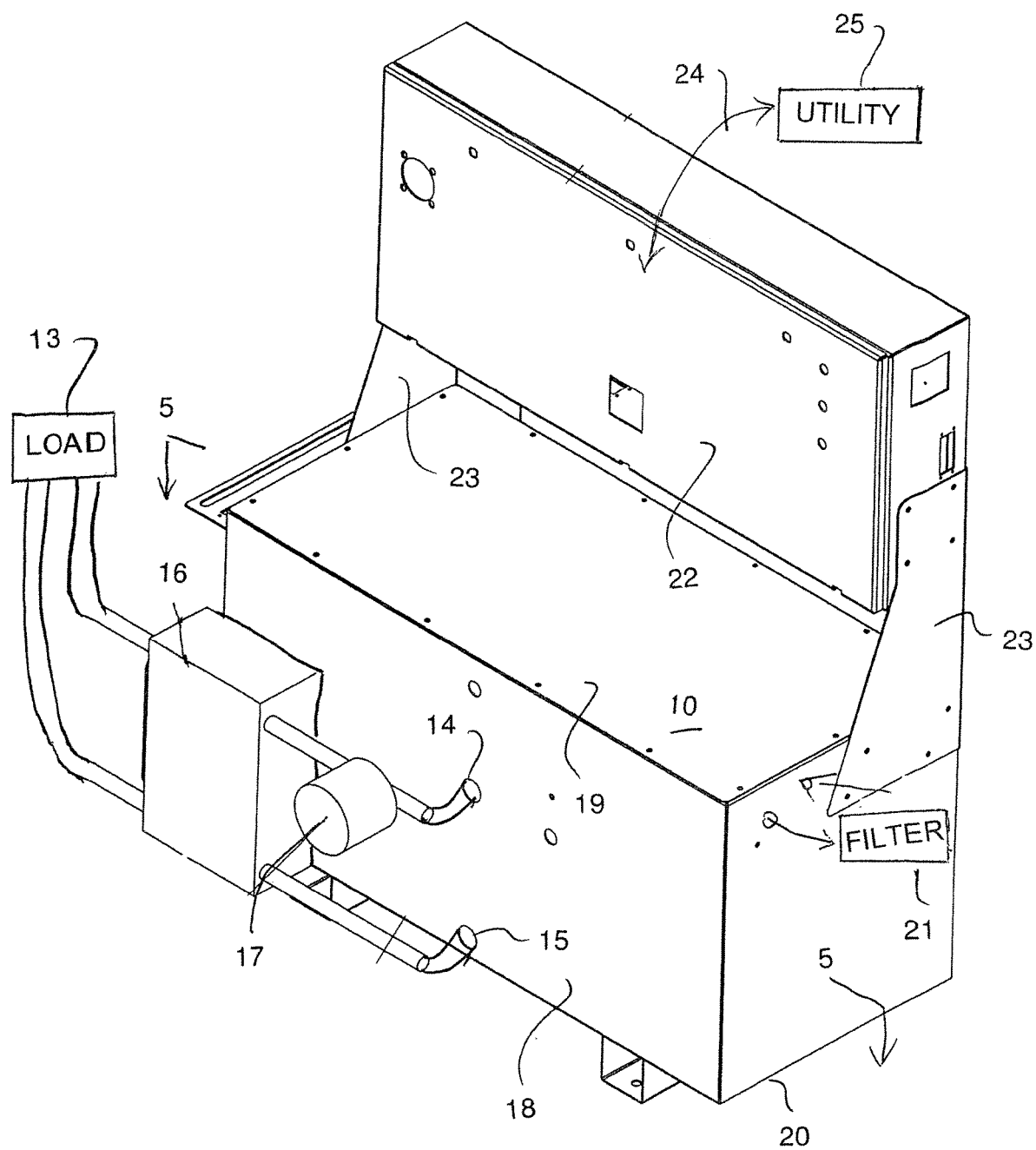
FIG. 1 is an isometric view of one embodiment of the complete apparatus including the cooling tank, heat exchanger, heating load, electrical connections and connection to the power utility according to the present invention.
Figure 2:
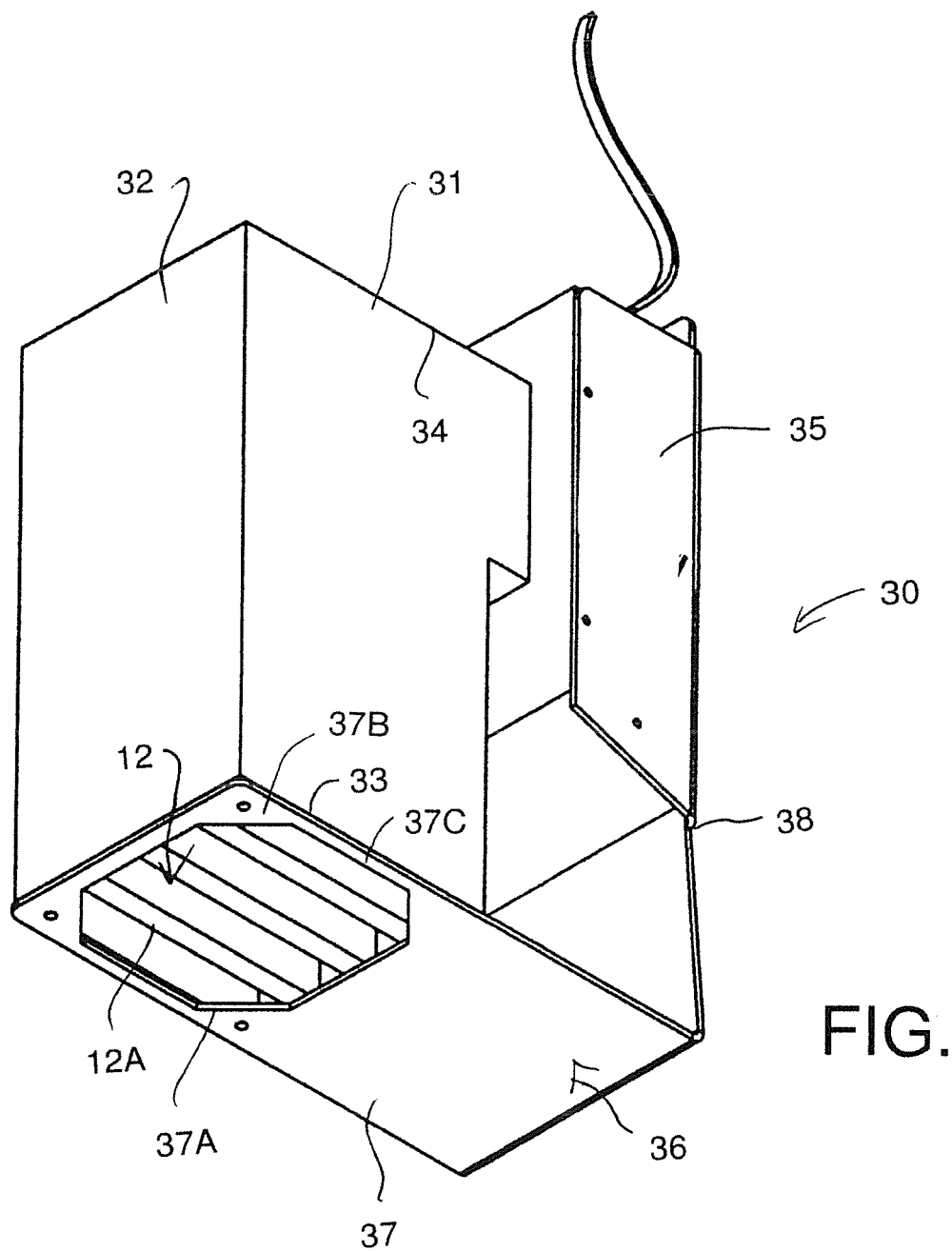
FIG. 2 is an isometric view of a processing unit and power supply mounted on a mounting bracket for mounting inside the tank of FIG. 1.
Figure 4:
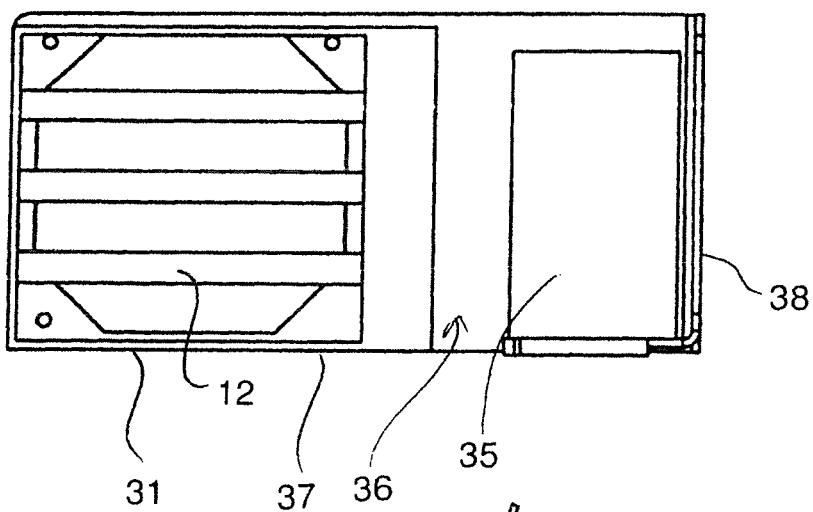
FIG. 4 is s top plan view of the processing unit and power supply and bracket of FIG. 2.
Figure 3:
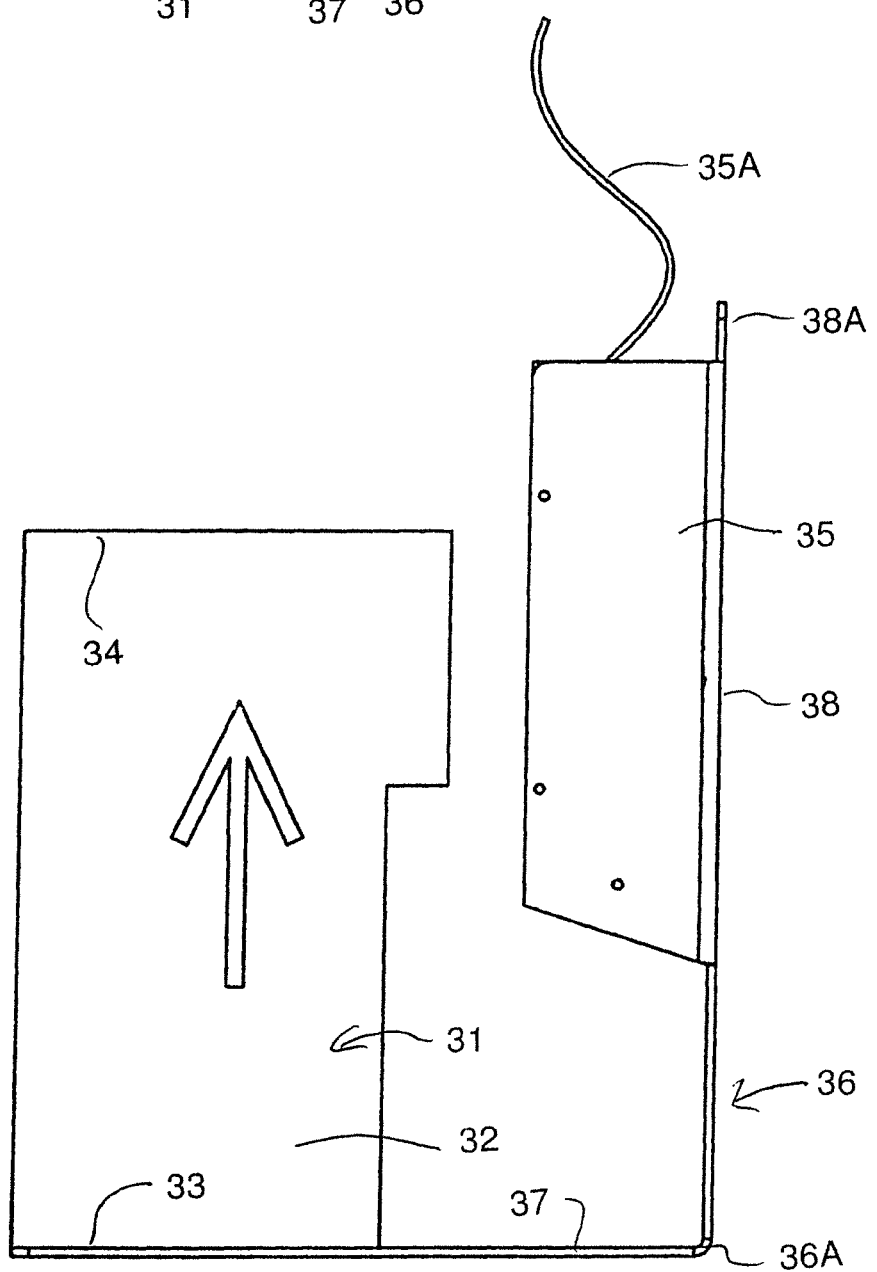
FIG. 3 is s side elevational view of the processing unit and power supply and bracket of FIG. 2.

The arrangement here in provides a tank 10 containing a cooing liquid 11 for cooling a plurality of circuit boards 12 and transferring the heat therefrom to a load 13. The cooling liquid 11 is extracted from the tank through a discharge opening 14, passed through a heat exchanger 16 and returned to the tank through a return 15. A pump 17 is provided in the circuit through the heat exchanger to cause a flow in the liquid and to generate a low pressure at the return 15.

The tank comprises a rectangular body with four upstanding sides 18, a top cover 19 and a base 20. This forms a closed container where the tank has a head zone above the level 11A of the liquid and below the top 19 that also acts as an expansion area to accommodate fluid level fluctuations. The head zone is kept free from any moisture by an extraction and a filter system 21 to filter out any particulate material from the liquid as well as any moisture. The tank is thus sealed and vapour tight.

The liquid in the tank filling the area between the base 20 and the top level 11A acts as a cooling liquid which is formed of a suitable dielectric material having the characteristics defined above.

The tank carries a superstructure 22 mounted on end brackets 23 which connect the superstructure to the ends of the tank. The superstructure provides a rectangular housing which contains the electronics necessary to control the operation of the circuit boards and the communications necessary to operate the system. This includes a communication system 24 for communication with the power utility 25 supplying the necessary power to the processing system.

The tank 10 contains a plurality of computer processing units 30 arranged in an array of rows and columns in the tank. Each unit 30 includes an exterior tubular housing 31 defined by four rectangular sides 32 extending from a bottom face 33 to a top face 34. The top and bottom faces are generally open so that the housing forms a tubular duct through which the liquid can pas freely from the bottom face to the top face. The housing is a conventional housing structure which is supplied by many computer processing suppliers and typically the processing boards 12 within the housing are cooled by air flow generated by a fan on one or both ends of the housing. The fans are removed so that the existing housing containing the existing boards are now cooled by the liquid. The housing thus defines a bottom opening at a bottom end and a top opening at a top end and a closed peripheral wall between the top and bottom ends.

The computer processing boards carrying electrical components mounted within the housing are arranged as parallel boards at spaced positions across the housing. These operate to carry out computer processing operations in conventional manner while generating heat. As is well known the amount of processing power required for various high processing operations generates high levels of heat which must be removed and which are sufficient for significant amount of space heating particularly in cold weather areas.

Each computer processing unit is associated with an adjacent power supply 35 in the form of a generally rectangular body containing convention components for the processing unit 30. There is provided an L-shaped holder bracket 36 mounted on the sheet and arranged to hold the housing and the power supply supported upright. The bracket includes a horizontal base plate 37 which extends across the bottom end 33 of the housing 31. An upstanding plate 38 connected to the base at an apex 36A carries the power supply on an inner face of the plate so that it is located adjacent the housing 31 and both are held generally parallel and slightly spaced. A connector 35A extends from the poser supply through the tank to an exit gland (not shown) to the control system in the superstructure.

Figure 5:
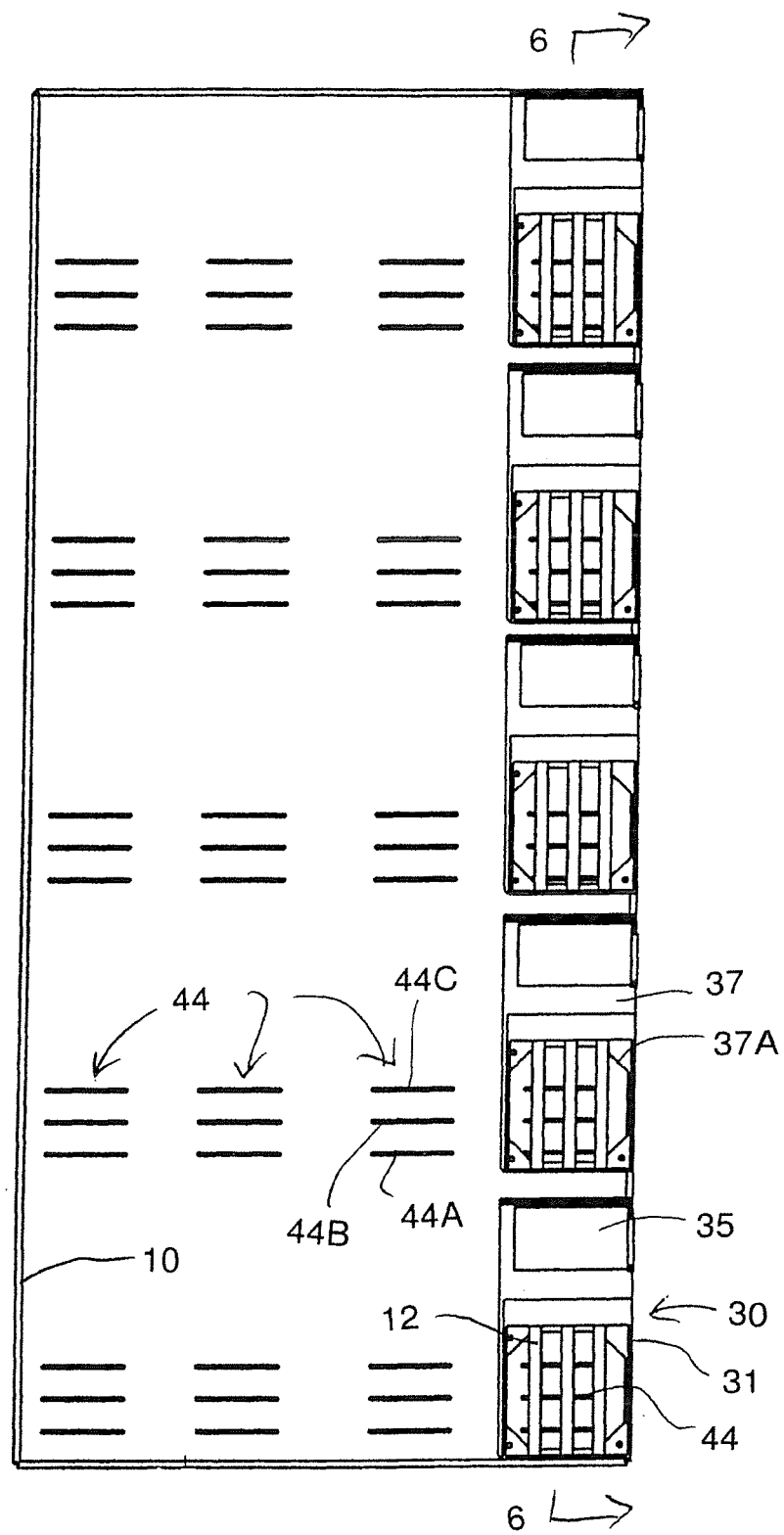
FIG. 5 is a cross-sectional view along the lines 5-5 of FIG. 1 showing the interior of the tank.

The bracket 36 has in the base 37 and opening 37A which exposes the bottom end 12A of the boards 12 for entry of the cooling liquid through the base 37 into the tubular housing 31. The opening is generally rectangular so that the edges 37C are parallel to the side walls 32. However triangular flanges 37B are located at the corners for attachment of similar shaped flanges at the bottom end 33 to be attached to the base 37. Thus the housing 31 and the boards 12 therein is attached to the base 37 and the power supply 35 is attached to the plate 38 enabling both to be mounted in the rows and columns shown in FIG. 5 within the tank.

The rectangular tank has a dividing sheet 40 in the tank 10 parallel to the base 20 dividing the tank into a bottom manifold 41 below the dividing sheet 40 and above the base 20 and a main portion of the tank 42 above the sheet 40.

The brackets 36 are fastened to the bottom sheet 40 in the rows and columns so that the exterior housing 31 of each computer processing unit is mounted on the sheet 40 with an opening at the bottom end 33 located at the sheet 40 and the peripheral wall 32 upstanding within the tank to the top end 34 which spaced from the dividing sheet 40.

In order for the cooling liquid to pass from the manifold 41 into each housing 32, a plurality of liquid transfer opening arrangements 44 are provided in the sheet where each opening arrangement 44 is associated with a respective one of the housings 31 to allow liquid from the manifold 41 to enter the housing 31 and pass through the opening 37A into the housing. The liquid enters the manifold through the return 15 and spreads in the manifold so the opening arrangements 44 for passage into the housings. The opening arrangements 44 as shown include a row of parallel spaced slots 44A, 44B and 44C which form an area generally matching the area of the opening 37A so that the slots are of a length matching the width of the housing 31.

The depth of the liquid is arranged so that the top surface11A of the liquid within the tank is at a position below the top wall 19 at a location and which is above the top end 35 of the exterior housings 31.

The liquid thus acts to enter through the opening arrangements 44 into the exterior housings and each provides an array which is shaped to match the interior shape of the housing to generate a smooth flow rising in the housings and to rise within the housings by convection caused by the heat within the housings and to exit from the housings through the top end 34 into the tank 10. This acts so that the liquid exits from the top ends 34 of the housings forming a heated layer 11B in the tank between the surface 11A and the top ends 34.

The liquid in the heated layer 11B is extracted through the discharge opening 14 which lies wholly in the stratified layer so that in effect only the heated stratified layer is removed.

Figure 6:
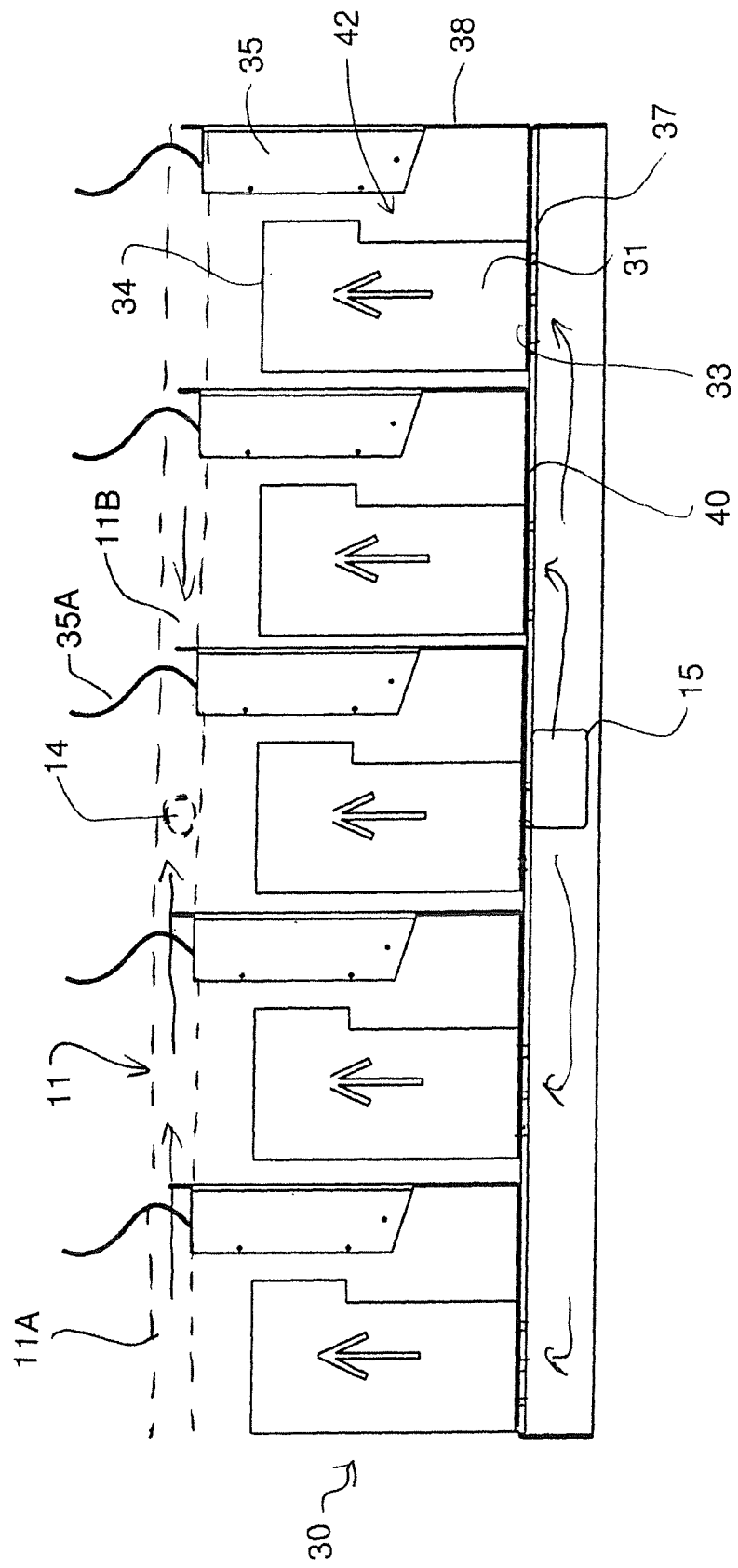
FIG. 6 is a cross-sectional view along the lines 6-6 of FIG. 4 showing the passage of liquid through the plate to the interior of the tubular housing.

As shown in FIG. 6, the top ends 34 all lie in a common plane defining a bottom of the layer 11B. The extracted liquid Is returned to the manifold by a pump arranged to create a slight positive pressure such that the liquid is caused to flow through the housings 31 substantially wholly by convection.

As explained above the opening arrangements 44 are located at the housings 31 such that the liquid only enters the housings 31 and not between the housings where little cooling is required as the power supplies are cooled sufficiently merely by the presence of the stationary liquid between the housings with any heated liquid rising into the stratified layer 11B.

The dielectric liquid is selected with the characteristics to cause very intense stratified temperature zone due to the inherent thermal insulating properties and allows a maximum heat transfer, a high working fluid temperature (above 50 degrees C.) and an efficient heat transfer.

Figure 7:
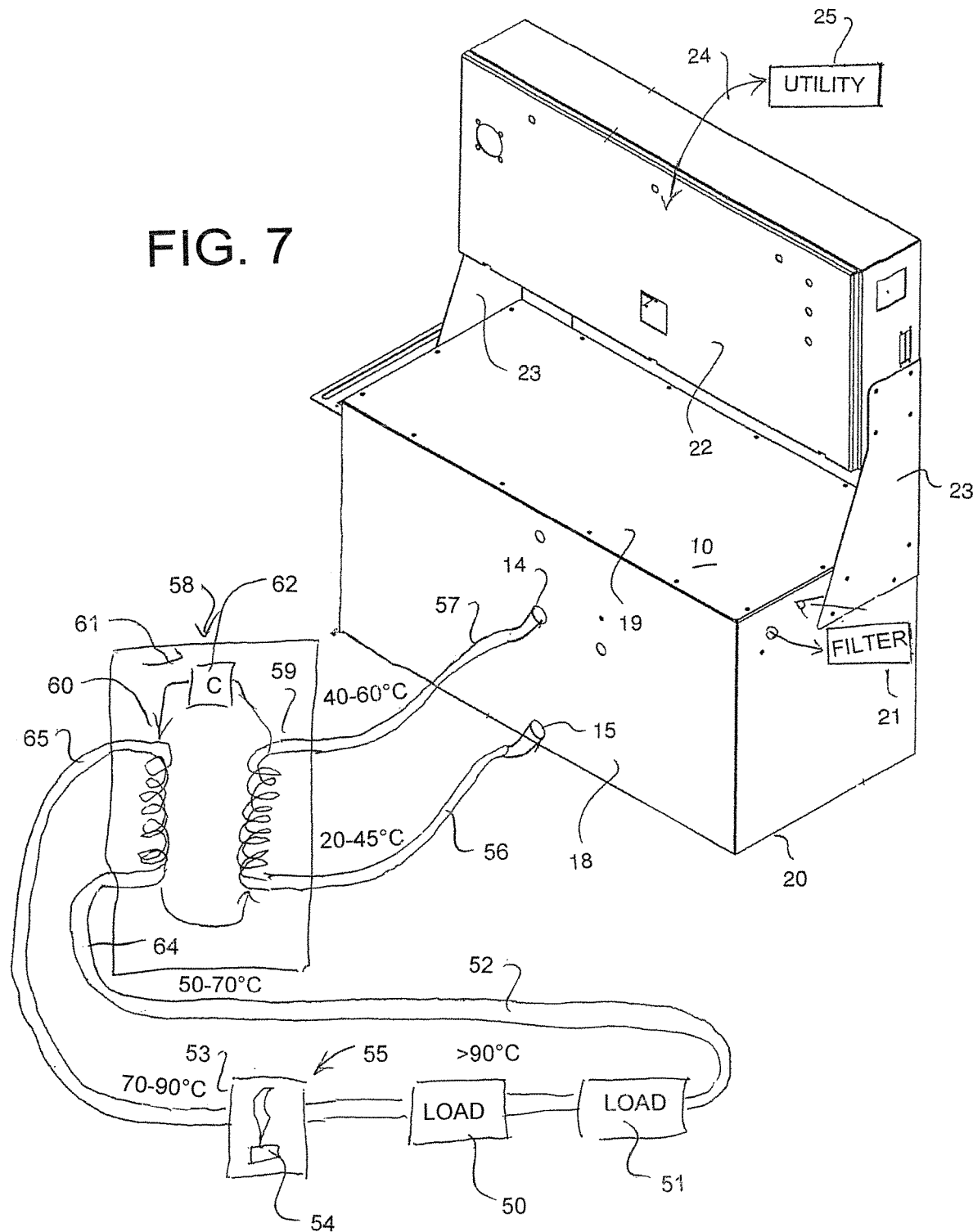
FIG. 7 is an isometric view of a further embodiment of the complete apparatus including the cooling tank, heating load, electrical connections and connection to the power utility which uses a refrigeration cycle type heat pump to generate specific temperatures for the heating system according to the present invention.

Turning now to FIG. 7, there is shown method for heating a series of heat dissipating loads 50, 51 etc using heat from the tank 20 and the computer processing units therein.

In the method a stream of a heat transfer liquid is generated passing through a circuit 52 which receives heat from the tank. The heat transfer liquid passes through a boiler 53 having a combustion heat supply 54 generating a heat source 55 attached to the circuit 52 so that the heat source 55 is able to apply heat to the heat transfer liquid in the circuit 52. The heat transfer liquid passes through the series of heat dissipating loads to transfer heat from the heat transfer liquid to the loads.

In the tank 20 is provided the a cooling liquid formed of a dielectric material as described above which cooperates with the plurality of computer processing units, each comprising at least one computer processing board carrying electrical components which operate to carry out computer processing operations while generating heat. The cooling liquid is driven by a pump or by convection to pass through the tank while causing cooling of the computer processing units so that the liquid is heated while cooling the computer processing units so as generate a first stream of cool liquid upstream of the heating of the liquid in the pipe 56 at the inlet 15 and a second stream of heated liquid downstream of the heating in the pipe 57 at the outlet 14.

The cooling liquid from the second stream 57 passes through a refrigeration cycle heat pump 58 to the first stream 56 so that the heat pump extracts heat from the second stream to return to the first stream 56. The heat pump is of the commercially available refrigeration cycle type using $CO_2$ as a refrigerant and having two coils 59 and 60 connected by a circuit 61 including a compressor 62;

The heat pump 61 acts to transfer the extracted heat from the cooling liquid from the tank to the heat transfer liquid in the circuit 52 so that the heat transfer liquid passes from an inlet stream 64 entering the heat pump to an exit stream 65 leaving the heat pump and so that the heat transfer liquid passes both through the heat source 55 and the heat pump 62 for receiving heat from both.

The invention claimed is:

1. A method for heating comprising:
   generating a stream of a heat transfer liquid;
   passing the heat transfer liquid through a heat source so that the heat source is able to apply heat to the heat transfer liquid;
   passing the heat transfer liquid through one or more heat dissipating loads to transfer heat from the heat transfer liquid to said one or more loads;
   providing in a tank a cooling liquid formed of a dielectric material;
   the tank containing a plurality of computer processing units, each comprising at least one computer processing board carrying electrical components which operates to carry out computer processing operations while generating heat;
   causing the cooling liquid to pass through the tank while causing cooling of the computer processing units so that the liquid is heated while cooling the computer processing units so as generate a first stream of cool liquid upstream of the heating of the liquid and a second stream of heated liquid downstream of the heating;
   circulating the cooling liquid from the second stream through a refrigeration cycle heat pump to the first stream so that the heat pump extracts heat from the second stream to return to the first stream;
   the heat pump transferring the extracted heat from the cooling liquid to the heat transfer liquid so that the heat transfer liquid passes from an inlet stream entering the heat pump to an exit stream leaving the heat pump and so that the heat transfer liquid passes both through the heat source and the heat pump for receiving heat from both.

2. The method according to claim 1 wherein the heat pump uses $CO_2$ as a refrigerant.

3. The method according to claim 1 wherein the temperature in the second stream of the cooling liquid is less than 60 degrees C. and the temperature in the exit stream of the heat transfer liquid is greater than 70 degrees C.

4. The method according to claim 1 wherein the temperature in the second stream of the cooling liquid is in the range 40 degrees C. to 60 degrees C. and the temperature in the exit stream of the heat transfer liquid is in the range 70 degrees C. to 95 degrees C.

5. The method according to claim 1 wherein the temperature in at least one of said one or more heat dissipating loads is at least 90 degrees C.

6. The method according to claim 1 wherein the temperature in the first stream of the cooling liquid is less than 45 degrees C. and the temperature in the inlet stream of the heat transfer liquid is greater than 50 degrees C.

7. The method according to claim 1 wherein the temperature in the first stream of the cooling liquid is in the range 20 degrees C. to 45 degrees C. and the temperature in the inlet stream of the heat transfer liquid is in the range 50 degrees C. to 70 degrees C.

8. The method according to claim 1 wherein the cooling liquid is circulated between the second and first streams by a liquid pump.

9. The method according to claim 1 wherein the cooling liquid is circulated between the second and first streams by convection currents.

10. The method according to claim 1 wherein the heat pump is located outside the tank.

11. The method according to claim 1 wherein the heat source comprises a boiler.

12. The method according to claim 11, wherein the boiler and said one or more heat dissipating loads comprise an existing installation and the tank, a cooling liquid, plurality of computer processing units and heat pump are added to the existing installation as a supplementary heat source.

13. The method according to claim 1 wherein the heat source uses a combustion source.

14. The method according to claim 1 wherein the cooling liquid is a vegetable oil.

15. The method according to claim 1 wherein the cooling liquid is soy bean oil or canola oil.

16. The method according to claim 1 wherein the cooling liquid has the one or more of the following characteristics:
Density: in the range of 0.92 g/m3 (7.667 lbs/gal)
Kinematic Viscosity: in the range of 33-35 mm?/s @ 40° C. or in the range of 15 cSt @ 70° C.
Dielectric Breakdown: 2 mm [kV] 235 (ASTM D6871)
Boiling point: ≥360° C.
Flash point: ≥265° C. (Closed Cup)
Auto/self-ignition temperature: 401-404° C. (ASTM E659)
Vapor Pressure: in the range 0 PA @≤200° C.
Thermal Conductivity: in the range of 0.15089 W/mK @ 70° C.
Specific Heat: in the range of 2.3472 kJ/kgK@ 70° C.

17. A method for heating comprising:

generating a stream of a heat transfer liquid;

passing the heat transfer liquid through one or more heat dissipating loads to transfer heat from the heat transfer liquid to said one or more loads;

providing in a tank a cooling liquid formed of a dielectric material;

the tank containing a plurality of computer processing units, each comprising at least one computer processing board carrying electrical components which operates to carry out computer processing operations while generating heat;

causing the cooling liquid to pass through the tank while causing cooling of the computer processing units so that the cooling liquid is heated while cooling the computer processing units so as generate a first stream of cool liquid upstream of the heating of the liquid and a second stream of heated liquid downstream of the heating;

circulating the cooling liquid from the second stream through a heat pump to the first stream so that the heat pump extracts heat from the second stream to return to the first stream;

the heat pump transferring the extracted heat from the cooling liquid to the heat transfer liquid so that the heat transfer liquid passes from an inlet stream entering the heat pump to an exit stream leaving the heat pump;

wherein the temperature in the second stream of the cooling liquid is less than 60 degrees C. and the temperature in the exit stream of the heat transfer liquid is greater than 70 degrees C..

18. The method according to claim 17 wherein the heat pump uses CO2 as a refrigerant.

19. The method according to claim 17, wherein the temperature in at least one of said one or more heat dissipating loads is at least 90 degrees C.

* * * * *